United States Patent [19]
Hanawa et al.

[11] Patent Number: 5,897,712
[45] Date of Patent: Apr. 27, 1999

[54] PLASMA UNIFORMITY CONTROL FOR AN INDUCTIVE PLASMA SOURCE

[75] Inventors: Hiroji Hanawa, Sunnyvale; Peter K Loewenhardt, San Jose, both of Calif.; Timothy D. Driscoll, Hamilton, Mont.; Gerald Zheyao Yin, Sunnyvale, Calif.

[73] Assignee: Applied Materials, Inc., Santa Clara, Calif.

[21] Appl. No.: 08/683,053

[22] Filed: Jul. 16, 1996

[51] Int. Cl.$^6$ .................................................. H05H 1/00
[52] U.S. Cl. .................... 216/68; 427/569; 156/345; 118/723 I
[58] Field of Search ................ 118/723 I, 723 IR; 427/569; 156/345; 204/298.08, 298.34; 315/111.21, 111.41–111.51, 111.61; 216/68

[56] References Cited

U.S. PATENT DOCUMENTS 5,241,245  8/1993  Barnes et al. .................. 315/111.41

FOREIGN PATENT DOCUMENTS 0 607 797  7/1994  European Pat. Off. .
0 690 666  1/1996  European Pat. Off. .

*Primary Examiner*—Thi Dang
*Attorney, Agent, or Firm*—Robert Wallace

[57] ABSTRACT

The present invention reduces those portions of the RF induction field over areas of the wafer experiencing higher etch or deposition rates than those experienced elsewhere on the wafer. Such a controlled reduction of those portions of the RF induction field whose attenuation results in reducing non-uniformity in the etch or deposition rate distribution is obtained by incorporating a plasma uniformity control apparatus into the inductively coupled plasma reactor. The incorporated plasma uniformity control apparatus for controlling the RF induction field produced by the antenna includes one or more conductive bodies which are disposed adjacent to one or more of the radiating elements of the antenna.

27 Claims, 9 Drawing Sheets

PLASMA UNIFORMITY CONTROL FOR AN INDUCTIVE PLASMA SOURCE

BACKGROUND OF THE INVENTION

1. Technical Field

This invention relates to inductively coupled plasma reactors used in the manufacture of products such as microelectronic semiconductor devices, and more particularly, to an apparatus and method for controlling the radio frequency (RF) induction field over the surface of the workpiecer being processed in such a reactor so as to produce a uniform etch or deposition rate.

2. Background Art

Inductively coupled plasma reactors for processing microelectronic semiconductor wafers are employed where high density plasmas are desired. For example, inductively coupled plasma reactors can produce plasma densities on the order of $10^{11}$ ions/cm$^3$. Referring to FIGS. 1–4, an inductively coupled reactor generally includes a reactor enclosure defining a processing chamber 12, a pedestal 14 within the chamber 12 for supporting a wafer 16 during processing, a gas inlet system 18 for admitting a gas into the chamber 12, a vacuum pump 20 to evacuate the chamber 12 to a desired pressure, an antenna disposed around or near a portion of the reactor chamber overlying the wafer, and a RF power source 22 connected to the antenna through an impedance matching network 24. The reactor may also include a second RF power source 26 connected to the pedestal 14 through a second impedance matching network 28. The second source 26 is used to create a bias potential on the wafer 16 which is beneficial in some wafer processing operations.

One type of inductively coupled plasma reactor is characterized by a flat coil antenna 30, as shown in FIG. 1. This antenna 30 is typically disposed in or adjacent to a flat top 32 of the reactor and lies in a plane generally parallel to the surface of the wafer 16 being processed. Another type of inductively coupled plasma reactor has a cylindrical antenna 34 disposed in or around a cylindrical sidewall 36 of the reactor, as shown in FIG. 2. Yet another type of inductively coupled plasma reactor has a dome-shaped antenna 38 disposed in or adjacent to a dome shape top 40 to the reactor, as shown in FIG. 3. Some inductively coupled plasma reactors even have combined antenna structures. For example, FIG. 4 depicts a reactor having an antenna 42 with a dome-shaped upper portion and a cylindrical bottom portion.

Inductively coupled plasma reactors are used for a variety wafer processing operations, such as etching, chemical vapor deposition, and so forth. These operations typically require a uniform etch rate or deposition rate across the entire surface of the wafer being processed. For example, non-uniform etching can result in damage to the microelectronic devices being formed on the wafer. One common cause of this damage is referred to as punchthrough. Punchthrough occurs when a portion of the wafer's surface is etched at a higher rate than the remaining surface. In order to ensure complete removal of the material being etched from the center portion, the etching process must be continued beyond the point where this material has been completely removed in a region of the wafer where the etch rate is higher. Punchthrough results from the unwanted etching of the underlying material layers in this region. Likewise, problems can arise in the absence of a uniform deposition rate. For example, depending on when the deposition process is terminated, a non-uniform deposition rate could result in areas of the wafer having a deposition layer which is either too thin or too thick in comparison with a desired layer thickness.

A uniform etch rate or deposition rate can be achieved by making the plasma density as uniform as possible in the region overlying the wafer. For the most part, a uniform plasma density is achieved by using the reactor's antenna to maintain an RF induction field in the chamber which produces a consistent ion current flux across the surface of the wafer (assuming a uniform distribution of processing gas within the chamber). Maintaining such an RF induction field has presented a problem when using currently existing inductively coupled plasma reactor configurations. For example, a reactor employing a flat coil antenna 30 (as shown in FIG. 1) can exhibit a higher RF induction field near the center of the wafer 16 than at the wafer's periphery. Generally, a higher RF induction field level in a region of the chamber will create a higher ion current flux in that region. Accordingly, a higher RF induction field level created over the center of the wafer 16 by a flat coil antenna 30 produces a high ion density or "hot spot" in the plasma over that area, while a lower ion density is exhibited at the wafer's periphery. Thus, the etch rate or deposition rate can be non-uniform across the wafer's surface. Even reactors having dome-shaped antennas (to ameliorate the non-uniform ion density problem) exhibit a non-uniform ion current flux, and therefore a non-uniform ion density, across the surface of the wafer. Likewise, reactors having combined antenna structures also tend to exhibit some degree of non-uniformity in the ion density over the wafer. For example, in the case of a reactor employing a combined antenna having a dome-shaped upper portion and a cylindrical lower portion, RF power from the cylindrical portion of the antenna is absorbed by the plasma near the chamber sidewall. This results in a higher ion density at the periphery of the wafer than at its center. Here again, the non-uniformity in ion density can result in an uneven etching or deposition over the surface of the wafer.

Varying reactor operating parameters, such as chamber pressure, processing gas composition, and RF power levels can also impact the ion current flux profile within the chamber for a given antenna configuration. Thus, one set of operating parameters might produce a desired uniformity in etching or deposition, whereas a different set of parameters may not. In view of this, a reactor may be limited to operating under the particular parameters which produce a substantially uniform etching or deposition rate. Such a limitation unduly restricts the reactor's processing capability.

Accordingly, there is a need to control the RF induction field over the surface of the wafer in such a way as to produce a uniform ion current flux (and so a uniform etch or deposition rate) in a variety of inductively coupled plasma reactor configurations and for a large range of operating parameters.

OBJECTS OF THE INVENTION

There is a need for a way of controlling the RF induction field over the surface of a semiconductor wafer being processed in an inductively coupled plasma reactor. The RF induction field in such a reactor produces an ion current flux density profile across the surface of the wafer which, in turn, plays an important part in determining the plasma ion density over the various parts of the wafer's surface. The ion current flux density over an area of the wafer directly influences the etch or deposition rate associated with that area. Thus, controlling the RF induction field ultimately controls the etch or deposition rate across the surface of the wafer. It is an object of the present invention to shape the RF induction field across the wafer in such a manner as to achieve a more uniform etch or deposition rate distribution across the surface of the wafer. Generally, the object of a uniform etch or deposition rate distribution across the wafer surface is achieved by shaping the RF induction field to be uniform so as to achieve a more uniform ion current flux density distribution across the wafer surface, although this is not necessarily the case. Therefore the general object of the invention is to shape the RF induction field in any manner (whether uniform across the wafer surface or not) that promotes a more uniform etch or deposition rate across the wafer surface.

SUMMARY OF THE INVENTION

The present invention meets the foregoing objects by reducing those portions of the RF induction field over areas of the wafer experiencing higher etch or deposition rates. Alternatively, invention meets the foregoing objects by reducing those portions of the RF induction field over areas of the wafer experiencing higher ion current flux densities than those experienced elsewhere on the wafer. Thus, the selection of those portions of the RF induction field which are to be attenuated may be made so as to at least partially compensate for either (a) observed non-uniformities in etch or deposition rate distribution or, (b) observed non-uniformities in ion current flux density distribution. In general, the invention provides a controlled reduction of those portions of the RF induction field whose attenuation results in enhancing uniformity of either (a) etch or deposition rate distribution or (b) ion current flux density distribution. Such a controlled reduction in the RF induction field is obtained by incorporating a plasma uniformity control apparatus into the inductively coupled plasma reactor. The reactor employed preferably includes, among other things, a reactor enclosure defining a processing chamber, an RF antenna having plural radiating elements disposed around or near a portion of the chamber overlying the wafer, and a RF power source connected to the antenna. The incorporated plasma uniformity control apparatus for controlling the RF induction field produced by the antenna includes one or more conductive bodies which are disposed adjacent to one or more of the radiating elements of the antenna. It is preferred that each conductive body be grounded, although leaving the body at a floating potential is also feasible. In addition, the control apparatus has a device for placing each conductive body at a position defining a prescribed separation distance in relation to each adjacent radiating element of the antenna. This separation distance determines a degree of attenuation the body causes in the RF induction field within the chamber. The closer the body is to the adjacent radiating element or elements of the antenna, the greater the attenuation of the part of the RF induction field produced by the element or elements.

The selected portion(s) of the RF induction field is attenuated in this manner only to the extent necessary to achieve a desired reduction in non-uniformity in etch or deposition rate distribution or, alternatively, ion current flux distribution, across the surface of the wafer. For example, if the etch or deposition rate, or alternatively, the ion current flux density, is essentially uniform with the exception of an area over the peripheral region of the wafer, then portions of the RF induction field affecting the wafer periphery would be attenuated a sufficient amount to lower the flux level in that region area.

Preferably, the attenuation of the RF induction field does not exceed the minimum attenuation required to achieve the goal of a more uniform ion current etch or deposition rate distribution or ion current flux distribution. This is preferred because any attenuation of the RF induction field lowers the overall average etch or depostion rate. A significant reduction in the average flux level could slow down the etch or deposition process, thereby increasing wafer throughput time. By attenuating only those portions of the RF induction signal necessary to produce a uniform ion current flux, the final uniform flux level across the surface of the wafer is as close to the original average flux level as possible. It is noted, however, that if the final flux level is unacceptably low, it is possible to increase the power to the antenna to compensate for the attenuation losses.

The apparatus for placing each conductive body at the prescribed separation distance from each adjacent radiating element or elements of the antenna may be a fixed type wherein the separation distance can not be changed. Alternatively, the placement device can be an adjustable type wherein each conductive body can be moved toward or away from their adjacent antenna radiating element or elements, thus making the separation distance adjustable. If the placement device is an adjustable type, it is preferred that it be capable of separating each conductive body from its adjacent radiating element or elements of the antenna by a distance which will cause no more than a negligible attenuating effect on the corresponding RF induction field component. A body would be placed at this position when the radiating element or elements adjacent thereto are not responsible for producing the higher ion current flux region within the reactor chamber. In addition, it is also preferred that the surface of a conductive body facing the antenna be capable of placement as close as possible to its adjacent antenna radiating element or elements without touching the same. This latter position causes a maximum degree of attenuation of the part of the RF induction field associated with the adjacent radiating element or elements. Finally the placement device is preferably capable of placing a conductive body anywhere between the aforementioned limits (i.e. the position having a negligible effect and the position having a maximum effect). Thus, a range of attenuation levels is possible depending on where the conductive body is positioned by the placement device.

In one embodiment of the present invention, separate conductive bodies are disposed adjacent respective portions (which may be respective radiating elements) of the antenna and the adjustable placement device is employed. Thus, the portion of the RF induction field produced by each antenna portion can be separately attenuated by individually setting a separation distance between it and the adjacent antenna portion. This embodiment of the plasma uniformity control apparatus has the advantage of providing maximum flexibility in controlling the RF induction field within the reactor chamber. Such a high degree of flexibility can be quite useful in cases where the reactor's antenna produces a variable ion current flux profile or where it is desired to frequently change certain operating parameters (such as chamber pressure, processing gas composition, and RF power levels) which tend to alter the ion current flux profile. For example, each conductive element can be initially positioned to establish a uniform ion current flux across the surface of the wafer, and thereafter readily repositioned as necessary to maintain a uniform ion current flux in the face of changing conditions.

In many cases, however, the operating parameters are not changed often and the ion current flux created by the reactor's antenna is higher only over one specific area of the wafer. In these cases it is preferred that a single conductive body be employed. This single body would be capable of being disposed adjacent to a single portion of the antenna, or each one of a group of neighboring antenna portions or radiating elements, whose attenuation would reduce non-uniformity in the etch or deposition rate distribution across the wafer surface. An embodiment employing a single conductive body has the advantage of being simpler and more easily incorporated that a multi-body configuration.

Some reactors may exhibit higher ion current flux levels over more than one area of the wafer, but the areas affected are few and consistently in the same spot. In such a case, it is preferred that an embodiment of the apparatus be employed which has a separate conductive body adjacent to the radiating element or elements of the antenna responsible for creating each of the higher flux regions. For example, if a reactor exhibits peak ion current flux levels over two different regions of the wafer, one conductive body would be disposed adjacent an antenna portion affecting ion current flux over the one region, and a second body would be disposed adjacent the antenna portion affecting ion current flux over the other region. This limited multi-body embodiment is more complex than the single body version, but it is still simpler than the embodiment having a separate body adjacent every radiating element of the antenna.

The versions of the conductive body which are disposed adjacent to more than one radiating element of the antenna can be configured so as to produce a differing degree of attenuation in each element. This would be useful in situations where the region of higher ion current flux is characterized by a non-uniform flux profile. For example, a non-uniform flux profile may result when some of the radiating elements in a group responsible for the ion current flux in the region produce components of the RF induction field which are stronger than other elements in the group. In this case, it is believed the stronger field components would require a higher degree of attenuation to create a flux level in the region which is consistent with the rest of the wafer's surface. The desired variable attenuation can be accomplished by shaping the surface of the body so that at a particular body placement position, the portions of the body's surface adjacent those radiating elements producing the stronger field components are closer than the portions adjacent the other elements. Specifically, the difference in the separation distances between the surface and each radiating element would be a function of the difference in the field component strengths produced by each element.

In addition to the just described benefits, other objectives and advantages of the present invention will become apparent from the detailed description which follows hereinafter when taken in conjunction with the drawing figures which accompany it.

DESCRIPTION OF THE DRAWINGS

The specific features, aspects, and advantages of the present invention will become better understood with regard to the following description, appended claims, and accompanying drawings where:

DETAILED DESCRIPTION OF THE PREFERRED EMBODIMENTS

The preferred embodiments of the present invention are based on the principle that when RF current flows in an antenna of an inductively coupled plasma reactor adjacent a body made of a conductive material, a current is induced in the body of conductive material. The direction of this induced current is such that it produces a magnetic field which counteracts the magnetic field produced by the antenna. The net result of the counteracting effect is to attenuate or reduce the RF power coupled into the reactor chamber from the portion of the antenna which is directly adjacent the conductive body because the RF induction field created in the chamber by the antenna is attenuated. In essence, a portion of the energy from the antenna couples to the conductive body, thereby leaving less energy to couple into the chamber to the plasma. The closer the conductive body is to the antenna, the larger the counteracting effect becomes. Thus, as the distance between the conductive body and the portion of the antenna adjacent the body is made smaller, less and less power is coupled into the chamber from that portion of the antenna.

This phenomenon is advantageously employed in the present invention to attenuate portions of the RF induction field affecting regions of the wafer experiencing ion current flux densities exceeding those found elsewhere over the wafer. Preferably, the portions of the RF induction field selected for attenuation are attenuated no more than necessary to achieve a desired reduction in non-uniformity of ion current flux distribution across the wafer surface. While in most cases a uniform etch or deposition rate distribution is achieved by a uniform ion current flux distribution, in some cases it is possible that a non-uniform ion flux current distribution may be required to compensate for non-uniformities in other plasma processing parameters (such as process gas distribution in the chamber), in achieving a uniform etch or deposition rate distribution. In any case, the ultimate goal of the present invention is to adjust the RF induction field across the wafer in whatever manner is required to achieve a more uniform etch or depostion rate distribution.

Figure 1:
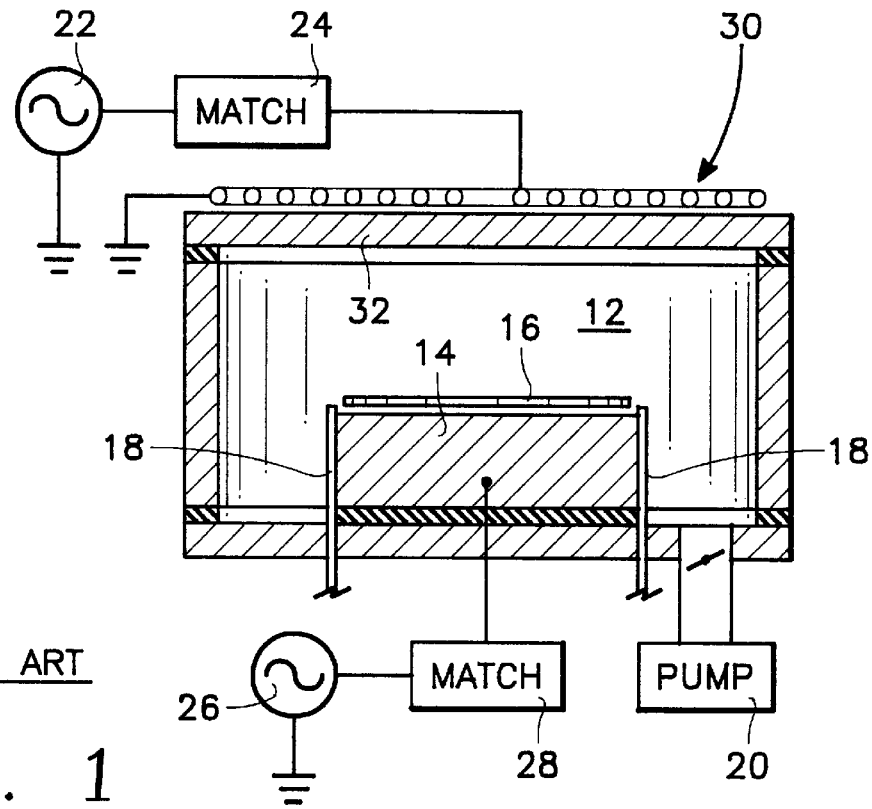
FIG. 1 a cross-sectional view of an inductively coupled plasma reactor employing an overhead flat coil antenna.
Figure 2:
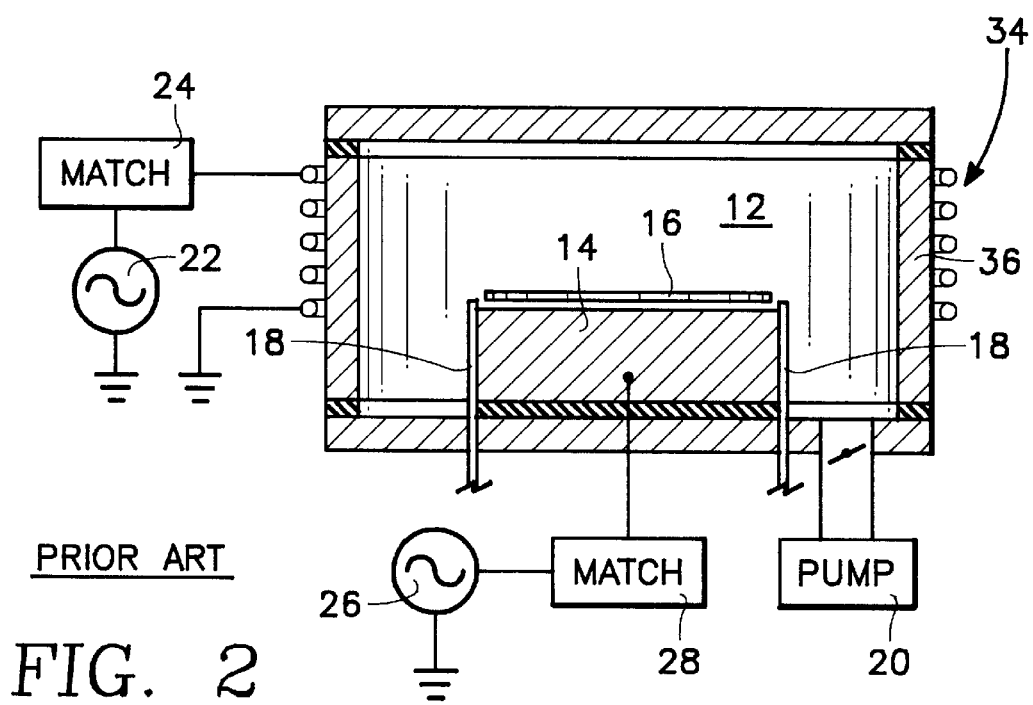
FIG. 2 a cross-sectional view of an inductively coupled plasma reactor employing a cylindrical antenna.
Figure 3:
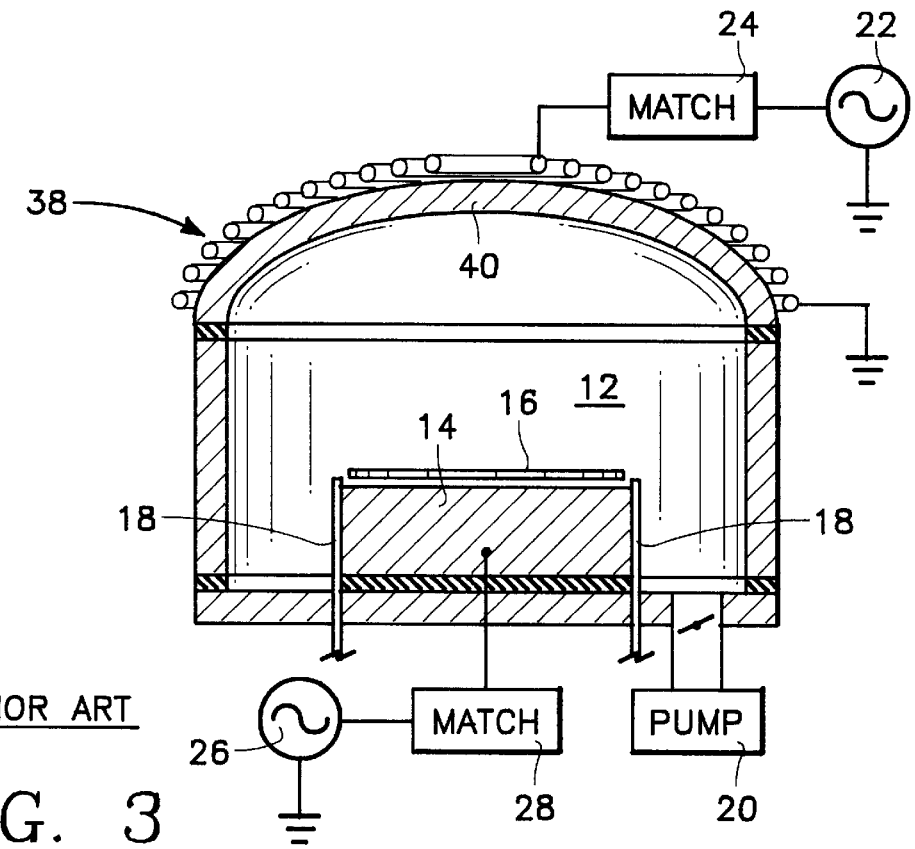
FIG. 3 a cross-sectional view of an inductively coupled plasma reactor employing a dome-shaped antenna.
Figure 4:
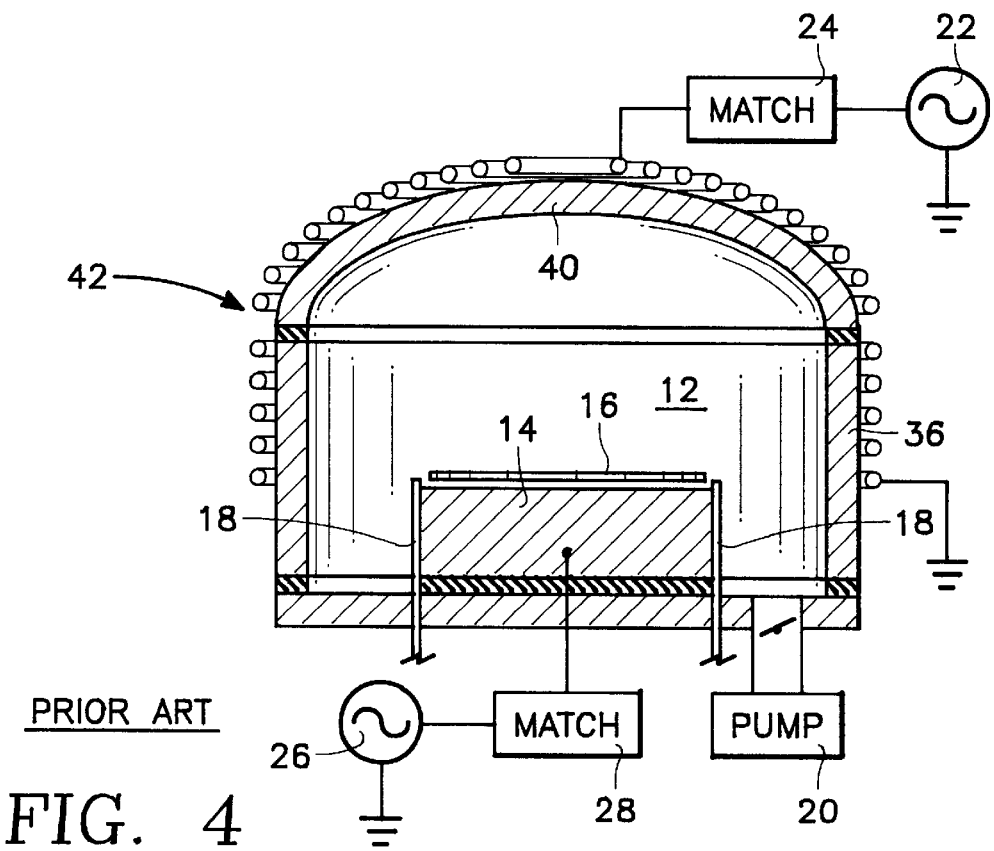
FIG. 4 a cross-sectional view of an inductively coupled plasma reactor employing an antenna have a dome-shaped portion overlying a cylindrical portion.
Figure 5:
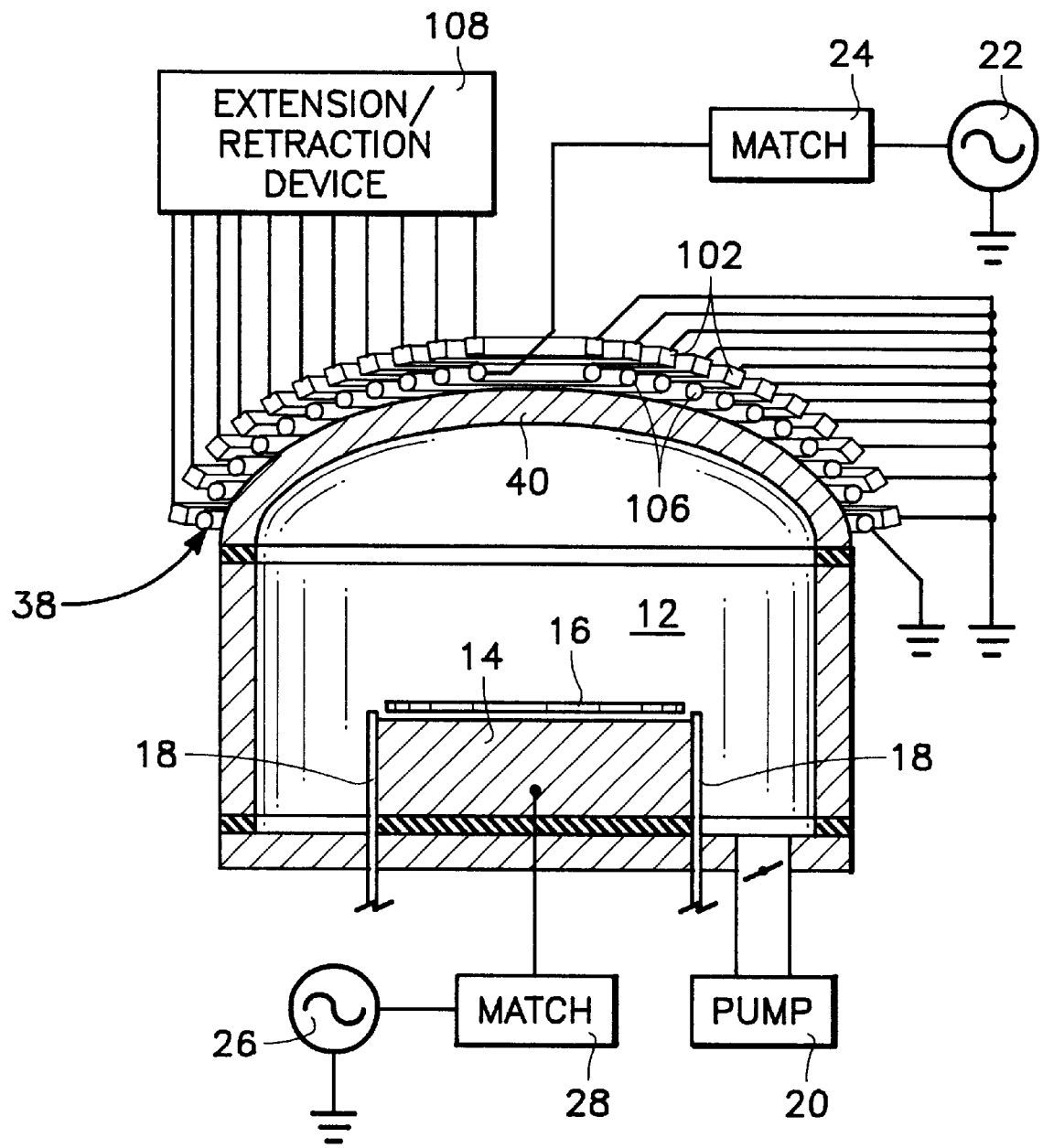
FIG. 5 an exemplary cross-sectional view of the inductively coupled plasma reactor of FIG. 3 incorporating a plasma uniformity control apparatus in accordance with one embodiment of the present invention wherein an RF induction field attenuating conductive element is disposed adjacent each loop of the antenna.

In a broad sense, the present invention can be embodied in the inductively coupled plasma reactor shown in FIG. 5 which incorporates a plasma uniformity control apparatus having multiple conductive bodies 102 mounted around the outside of the antenna 38. The reactor depicted is one having a dome-shaped antenna 38, although other antenna configurations can be employed as well. The dome-shaped antenna 38 shown has a series of connected 360-degree antenna loops 106 corresponding to the aforementioned radiating elements of the antenna. A separate conductive body 102 is mounted adjacent to each loop 106 of the antenna such that a surface of the body faces the entire 360-degree extent of the adjacent loop.

The conductive bodies 102 shown in the embodiment of FIG. 5 are capable of being moved toward or away from an adjacent portion of the antenna 38 to set a separation distance which will produce a uniform ion current flux across the surface of the wafer. At some point the separation distance between a conductive body 102 and the antenna 38 becomes large enough that the conductive body will have a negligible effect on the coupling of power into the reactor chamber 12. This is because the induced current producing the counteracting magnetic field will be too small to have a significant impact. It is preferred that each conductive body 102 be capable of being moved away from the respective adjacent portion of the antenna 38 at least to a distance where it will have a negligible effect on the coupling of RF power into the chamber 12. In addition, it is preferred that the conductive bodies 102 be capable of being moved as close as possible to their respective adjacent portions of the antenna 38 without touching (i.e. the point of maximum attenuation), and anywhere in between this maximum attenuation position and the aforementioned negligible attenuation position. It is also preferred that each conductive body 102 be shaped such that a face thereof is directed toward at least one complete 360 degree loop 106 of the antenna 38. In this way, the attenuating effect of each conductive body 102 does not vary circumferentially within the chamber 12. The conductive bodies 102 are also preferably grounded, although they could also be left at a floating potential if desired.

The portion of the RF inductive field produced by each antenna loop 106 is controlled by adjusting the distance between it and the adjacent conductive body 102. Accordingly, the overall field profile within the chamber 12 is determined by the aforementioned separation distances. Ideally, the conductive bodies 102 would be fully retracted away from their respective antenna loops (thereby having a negligible effect of the RF induction field) with the exception of those loops 106 primarily responsible for producing the field in an area of the reactor chamber 12 exhibiting an ion current flux exceeding the general or average ion flux level across the rest of the surface of the wafer 16. This is done to preserve as much as possible the overall average ion current flux level as will be explained in more detail later in this description.

The conductive bodies 102 are extended and retracted to set the desired separation distance between each conductive body and its adjacent antenna loop 106 using an appropriate extension-retraction device 108. As devices 108 capable of performing the task are known in the art and are not a novel part of the present invention, a detailed description is not provided herein.

The extension-retraction device 108 makes it possible to change the separation distance associated with each conductive body 102 as desired. This feature, along with a separate conductive body 102 being disposed adjacent to each loop 106 of the antenna 38, gives the embodiment of the invention depicted in FIG. 5 a high degree of control over the RF induction field in the reactor. The high degree of control can be quite useful in cases where the reactor's antenna produces a variable ion current flux density distribution or where it is desired to frequently change certain operating parameters (such as chamber pressure, processing gas composition, and RF power levels) which tend to alter the ion current flux density distribution. For example, each conductive body can be initially positioned to establish a uniform ion current flux across the surface of the wafer, and thereafter repositioned as necessary to maintain a uniform ion current flux in the face of changing conditions. Alternatively, in special cases, a non-uniform RF field or non-uniform ion current flux may be provided to compensate for non-uniformities in other plasma processing parameters (e.g., process gas distribution) so as to achieve a uniform etch or deposition rate distribution.

Although the apparatus depicted in FIG. 5 provides a high degree of control over the RF induction field characteristics of the inductively coupled plasma reactor, it is believed that the ion current flux density distribution can be made substantially uniform in most inductively coupled plasma reactors using simpler embodiments of the present invention. It has been observed that the ion current flux profile exhibited by most inductively coupled plasma reactors does not significantly vary with time and that the operating parameters employed in wafer processing are not often changed. In such cases, it would be possible to forego the previously-described adjustable extension-retraction device in favor of a placement device (not shown) which permanently fixes the separation distance between each conductive body 102 and the adjacent antenna loop 106. The separation distances would be chosen as before, i.e. the conductive bodies 102 adjacent antenna loops 106 responsible for producing a region of higher ion current flux would be set at a separation distance which results produces a uniform flux across the entire surface of the wafer 16, while conductive bodies 102 adjacent antenna loops 106 not creating the higher flux regions would be set at a separation distance producing a negligible attenuating effect on the RF induction field. In this way, a uniform ion current flux can be obtained without the complexity of an adjustable placement device.

It has also been observed that most inductively coupled plasma reactors typically produce ion current flux profiles having higher levels either over the center portion of the wafer or over the peripheral portion of the wafer Accordingly, a single conductive body could be disposed adjacent to the specific radiating element or elements of the antenna which are primarily responsible for producing the RF induction field over the portion of the wafer exhibiting the higher ion current flux levels.

Figure 6A:
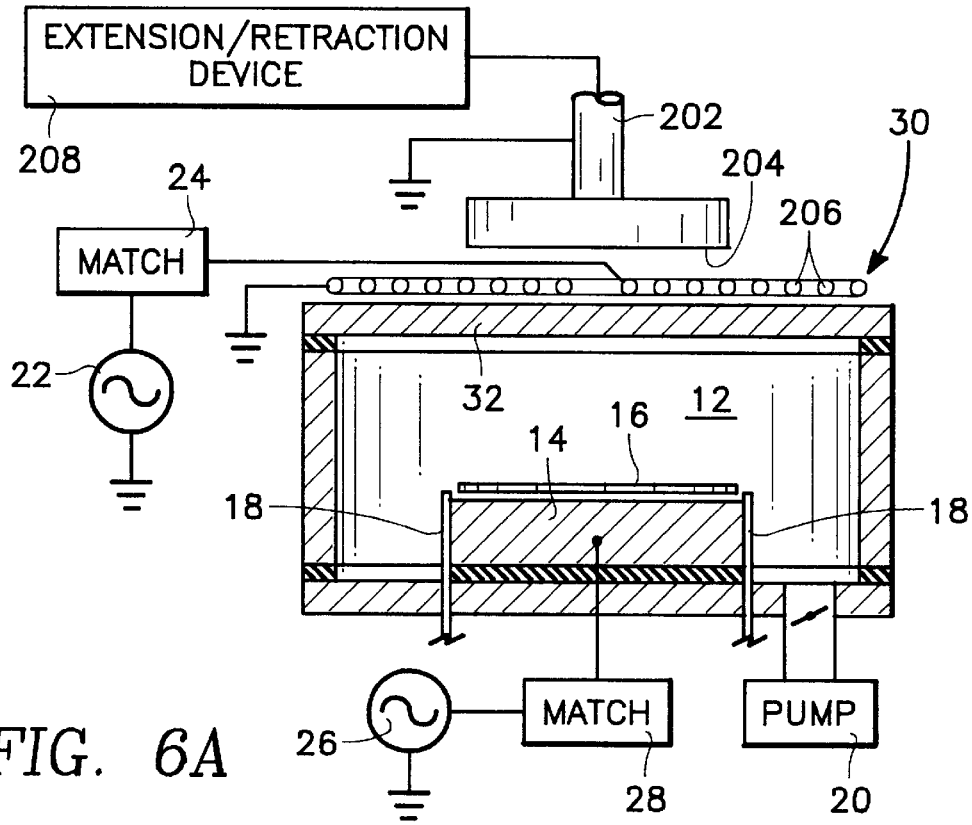
FIG. 6A is a cross-sectional view of the inductively coupled plasma reactor of FIG. 1 incorporating a plasma uniformity control apparatus in accordance with another embodiment of the present invention wherein a single RF induction field attenuating plunger with a flat surface is disposed adjacent the centermost loops of the antenna.

FIGS. 6A–B and 7A–B depict preferred embodiments of a conductive body disposed over the portion of the antenna primarily producing the RF induction field over the center of the wafer 16. These embodiments would be employed in reactors where the ion current flux is at a maximum over this area of the wafer. FIG. 6A shows a preferred conductive body in the form of a plunger 202 made of a conductive material, such as a metal. In this case the plunger 202 is employed in conjunction with an inductively coupled plasma reactor having a flat coil antenna 30 having multiple, connected, 360-degree antenna loops. The plunger 202 has a flat surface 204 facing the antenna 30. Thus, the attenuation of the RF power coupled into the chamber is substantially the same for every loop 206 of the antenna 30 adjacent to the plunger's surface 204.

Figure 6B:
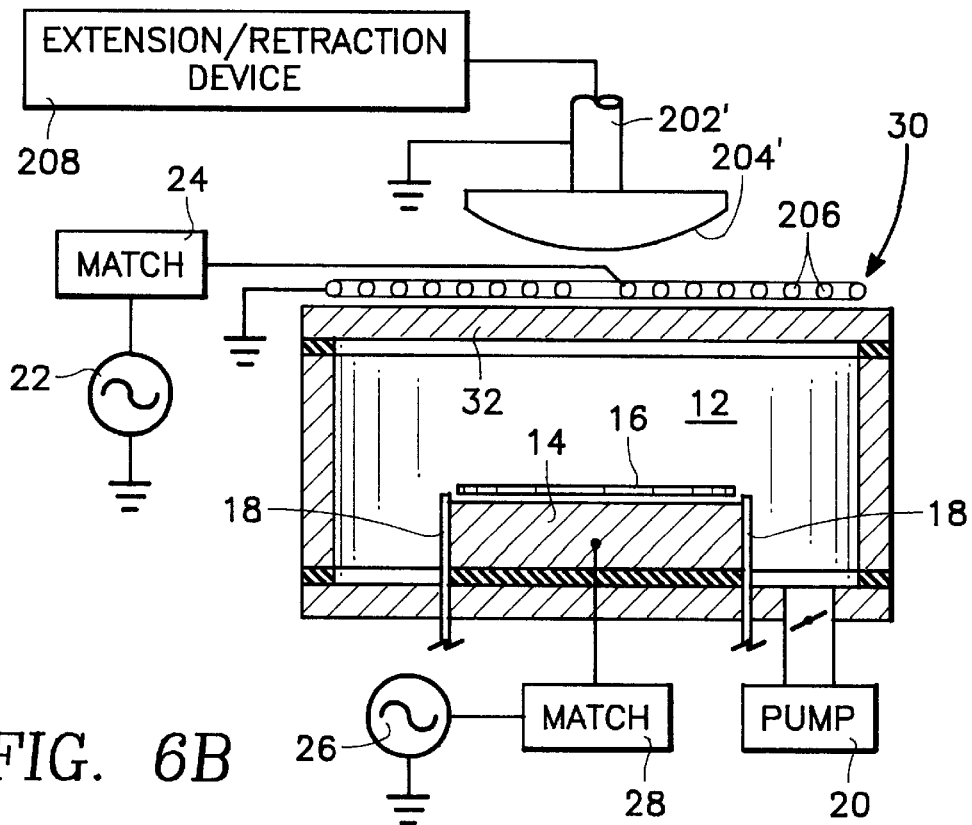
FIG. 6B is a cross-sectional view of the inductively coupled plasma reactor of FIG. 1 incorporating a plasma uniformity control apparatus in accordance with another embodiment of the present invention wherein a single RF induction field attenuating plunger with a convex surface is disposed adjacent the centermost loops of the antenna.

The surface 204 of the plunger 202 can also have a shape other than flat. For example, an alternate version of the conductive plunger 202' having a convex surface 204' facing the antenna 30, is shown in FIG. 6B. This convex surface 204' results in the loops 206 of the antenna 30 at its center being closer to the plunger 202' than the loops 206 further away from the antenna's center. Thus, the attenuation of the RF power coupled into the chamber 12 will be higher in those loops 206 closer to the center of the antenna 30. This center-biased attenuation is useful because the ion current flux profile typically exhibited by a flat coil antenna 30 decreases in the radial direction from the center of the wafer 16. Accordingly, the slope of the convex surface 204' of the plunger 202' is made such that the attenuated portion of the RF induction field transforms the ion current flux profile from one having a relatively high flux level over the center of the wafer and ramping down in the radial direction, to one exhibiting a uniform ion current flux profile across the entire surface of the wafer 16. This is done by shaping the plunger's surface 204' so that the separation distance between the surface and each adjacent loop 206 of the antenna 30 varies as a function of the differences between the RF induction field components associated with each loop. Of course, this same radially-varying attenuation could be obtained using the multiple conductive body apparatus (such as exemplified in FIG. 5) by positioning the conductive body adjacent the center loop closest, then positioning each succeeding body further away from their respective antenna loops. However, employing a single body with a "variable distance" surface provides a less complex approach and obtains similar results (at least for a given set of reactor operating parameters). For example, as there is only one conductive body in the embodiment of FIGS. 6A–B (i.e. the plunger 202, 202'), a simpler extension/contraction device 208 can be employed.

The "variable distance" surface concept can also be expanded to reactors employing other antenna configurations. Essentially, the surface of the plunger facing the antenna would be shaped such that portions thereof are spaced from the loops of the antenna as necessary to provide the attenuation needed to create a uniform ion current flux across the surface of the wafer.

Figure 7A:
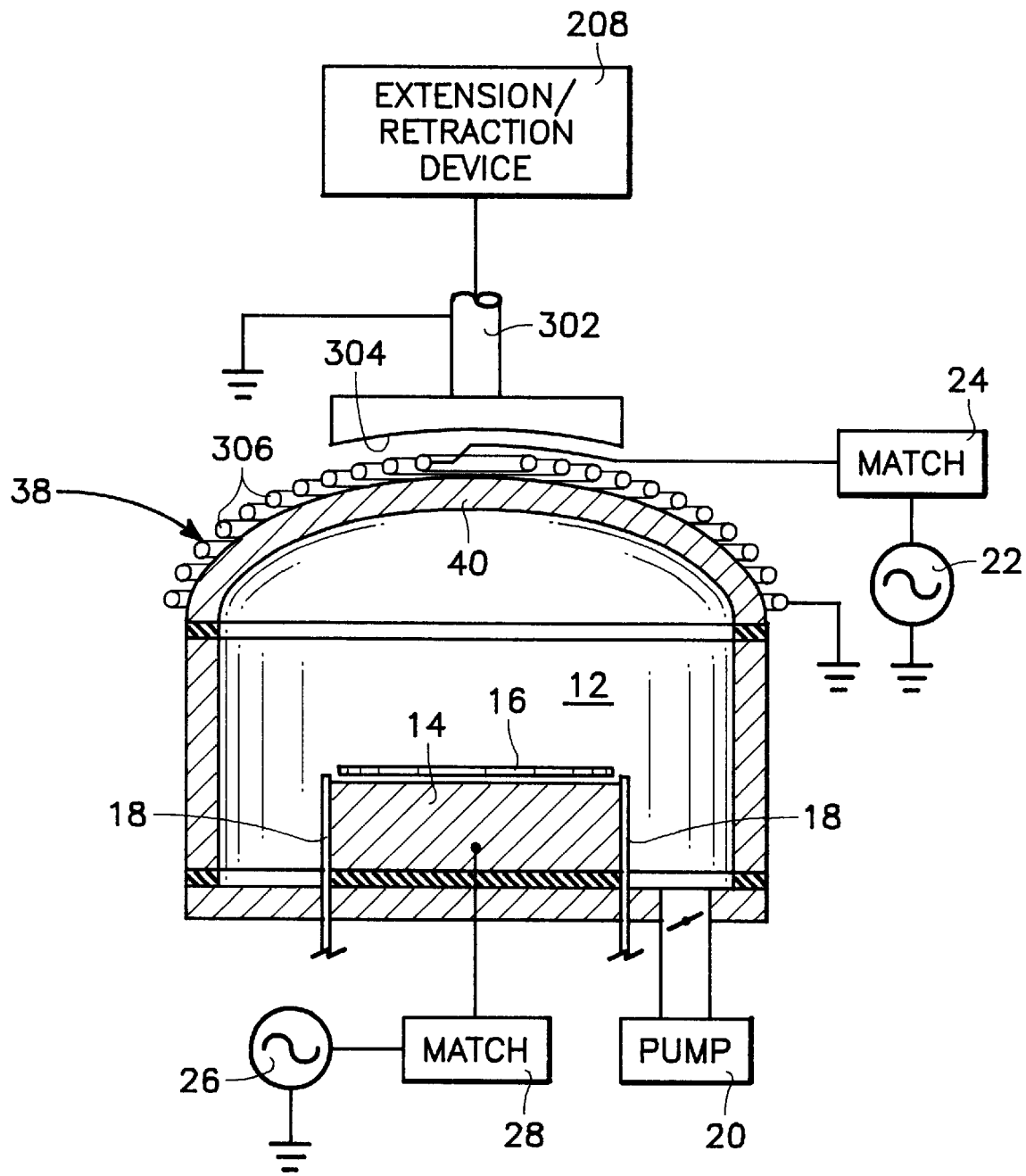
FIG. 7A is a cross-sectional view of the inductively coupled plasma reactor of FIG. 3 incorporating a plasma uniformity control apparatus in accordance with another embodiment of the present invention wherein a single RF induction field attenuating plunger with a concave surface is disposed adjacent the upper loops of the antenna.
Figure 7B:
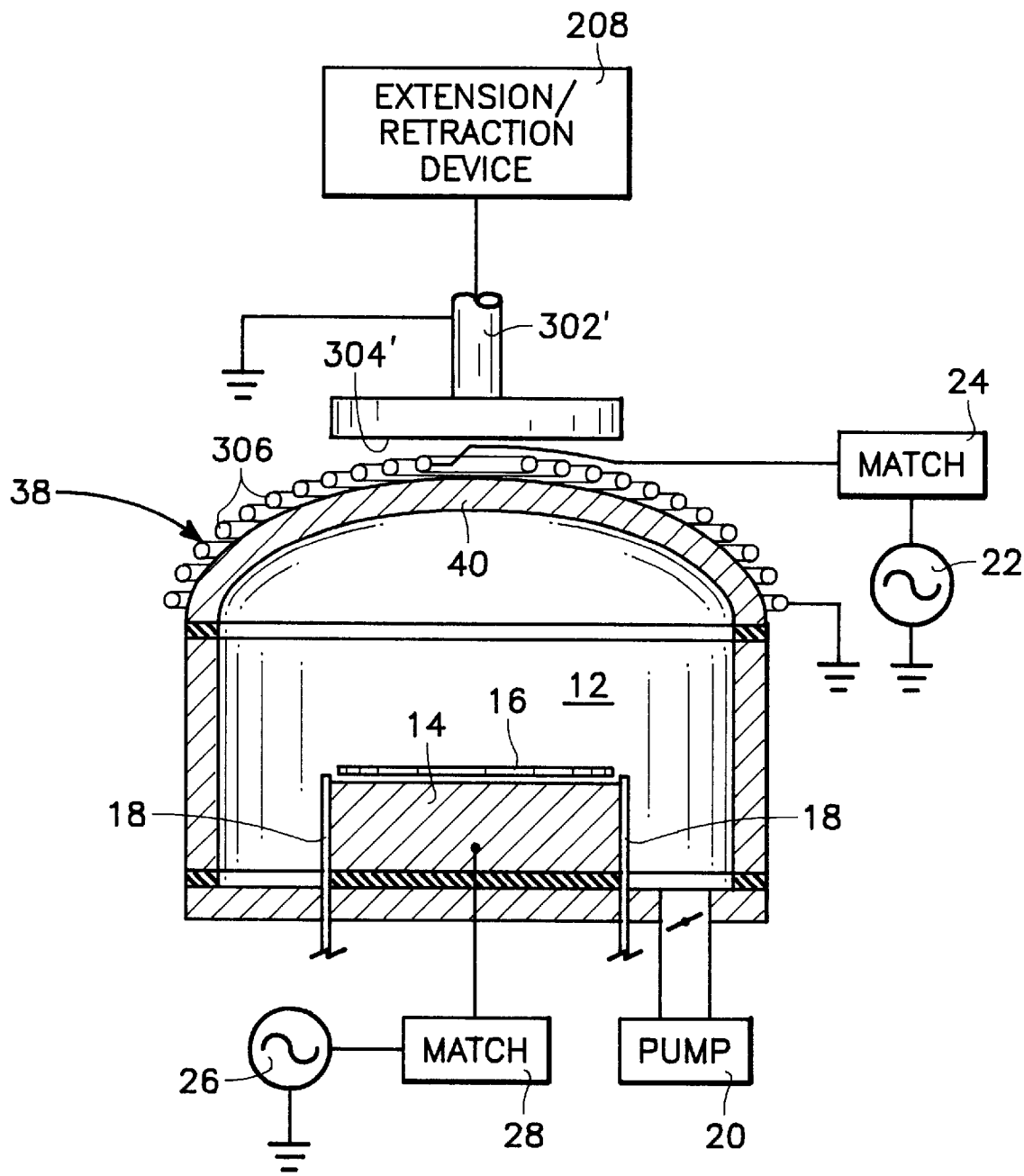
FIG. 7B is a cross-sectional view of the inductively coupled plasma reactor of FIG. 3 incorporating a plasma uniformity control apparatus in accordance with another embodiment of the present invention wherein a single RF induction field attenuating plunger with a flat surface is disposed adjacent the upper loops of the antenna.

FIGS. 7A–B show conductive plungers 302, 302' intended to attenuate the RF induction field over the center portion of the wafer 16 being processed in a reactor employing the previously-described dome-shaped antenna 38. FIG. 7A depicts a plunger 302 which provides a generally uniform attenuation of the field produced by adjacent loops 306 of the antenna 38. The surface 304 of this plunger 302 has a concave shape substantially matching the slope of the underlying dome antenna 38. As the plunger 302 is moved toward or away from the antenna 38 (using extension/retraction device 208), the induced current in the plunger 302 attenuates each component of the RF field in the chamber 12 corresponding to the loops 306 of the antenna 38 adjacent the plunger 302 to approximately the same degree. FIG. 7B shows an alternate plunger 302' which has a flat surface 304' and provides a variable attenuation of the field. This alternate plunger 302' provides a maximum attenuation of the field produced by the uppermost loop 306 of the dome-shaped antenna 38. Each successive lower loop 306 is less and less effected by the plunger 302', and so the attenuation of the field components corresponding to each of the successive loops 306 is progressively lower. The flat surface 304' of the "variable attenuation" plunger 302' shown in FIG. 7B is provided as an example only. This surface would actually be shaped as required to produce the amount of attenuation in each adjacent loop that is necessary to create a uniform ion current flux profile across the surface of the wafer. Thus, if necessary, the plunger surface facing the antenna may have a stepped or curved shape, rather than a flat shape.

Figure 8:
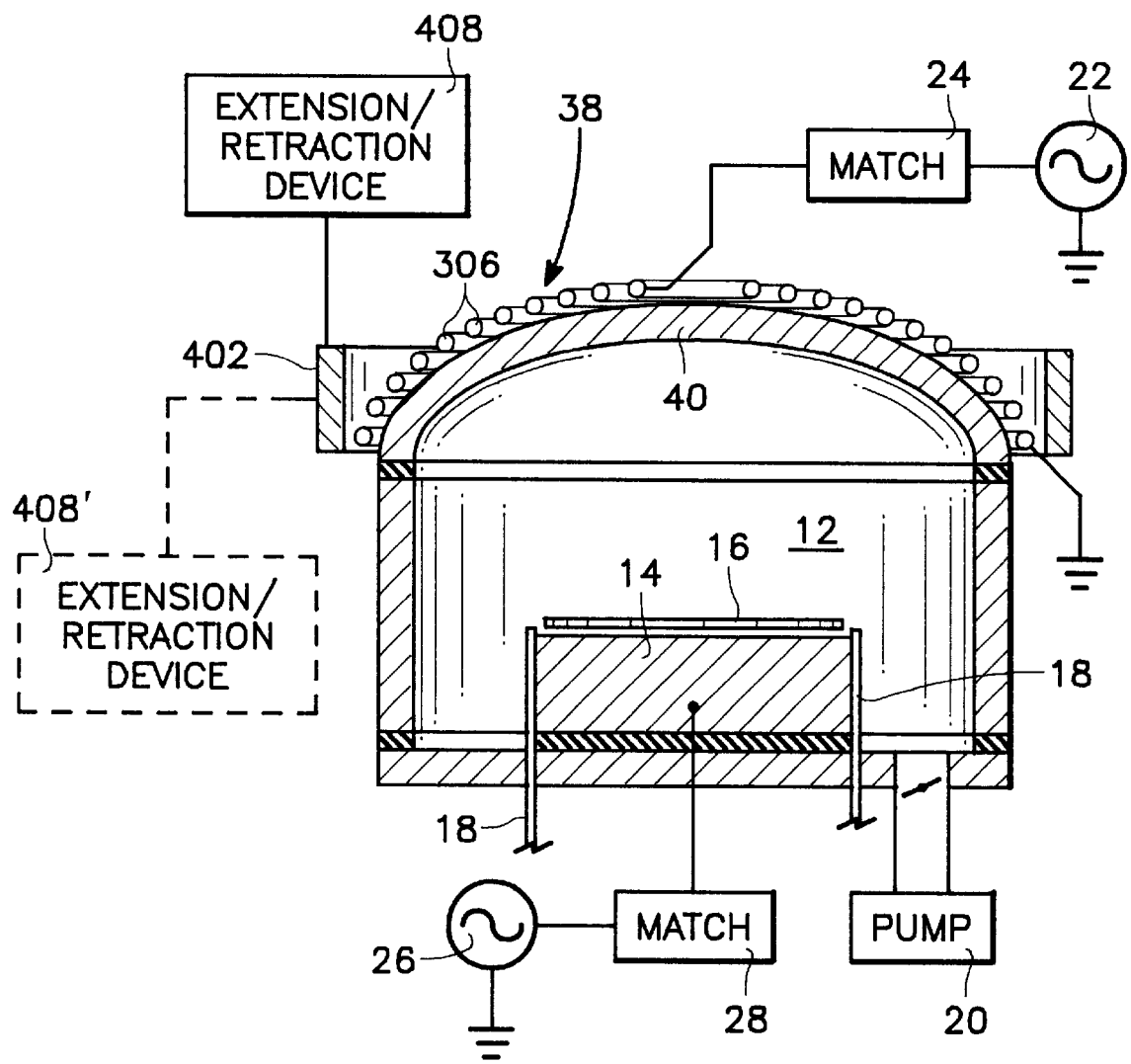
FIG. 8 is a cross-sectional view of the inductively coupled plasma reactor of FIG. 3 incorporating a plasma uniformity control apparatus in accordance with another embodiment of the present invention wherein a single RF induction field attenuating sleeve is disposed adjacent the lower loops of the antenna.

A single conductive body could also be disposed adjacent those loops of the antenna which primarily produce the RF induction field over the peripheral portion of the wafer in reactors exhibiting a higher ion current flux over that area. A plunger-type conductive body similar to the one described above could be employed, if desired, and would operate in a similar fashion. However, in reactors having dome-shaped and cylindrical antennas, the plunger would have to completely surround the reactor enclosure in order to face the entire 360-degree extent of a loop of the antenna. Thus, the plunger would have a ring-like structure. The mechanisms required to extend and retract such a ring-like plunger could be quite complex. Accordingly, a different type of conductive body which is more easily operated is preferred in reactors having dome-shaped and cylindrical antennas. FIG. 8 depicts an example of such a preferred conductive body which takes the form of a cylindrical sleeve 402 disposed around the outside of the antenna 38. The interior surface of the sleeve is closely adjacent the bottom loop 306 of the antenna 38. The loops 306 of the antenna 38 above the bottom loop 306 get progressively further away from the interior surface of the sleeve 402. This configuration causes the RF induction field component produced by the bottom loop 306 to experience a maximum attenuation while the field components associated with the overlying loops successively experience less and less attenuation. Thus, the sleeve 402 provides a variable-type attenuation similar to the "variable attenuation" plungers 202', 302' of FIGS. 6A and 7B, respectively. However, in this case the sleeve affects the lower loops 306 of the antenna 38, rather than the upper loops 306. The sleeve configuration is preferred for a reactor with a domed-shaped antenna which exhibits a higher peripheral ion current flux as it is believed the resulting variable attenuation pattern will create a more uniform ion current flux profile across the wafer.

In one version of the sleeve 402, the distance separating its interior surface from the antenna 38 is adjusted by expanding or contracting the sleeve so as to increase or decrease its diameter, respectively. The sleeve 402 remains in a concentric relationship with the antenna 38 during the expansion or contraction process. The expansion or contraction has the effect of varying the overall attenuation of the components of the RF induction field corresponding to the lower loops 306 of the antenna 38. As these lower loops 306 primarily affect the ion current flux at the periphery of the wafer 16, the expansion or contraction of the sleeve 402 ultimately affects the uniformity of the ion current flux by adjusting the flux near the periphery of the wafer 16. Any appropriate expansion-contraction device 408 can be employed for the purpose of expanding or contracting the sleeve 402.

An alternate method of varying the attenuating effect of the sleeve 402 is to raise or lower it, rather than expanding or contracting. As the sleeve 402 is raised, the lower loops 306 of the antenna 38 are exposed one by one starting with the bottom loop. This has the effect of reducing the overall attenuation of the RF induction field associated with the periphery of the wafer 16 because as each loop 306 is exposed, the attenuation of the field component corresponding to that loop is substantially eliminated. The change in the attenuation of the peripheral RF induction field would not be as uniform using the raising and lowering method as opposed to the expansion and contraction method. However, it is believed any non-uniformity will be insignificant and that a substantially uniform ion current flux can be created by either method. Any appropriate raising-lowering device 408' can be employed for the purpose of moving the sleeve 402. Appropriate expansion-contraction devices 408, as well as raising-lowering devices 408', are known in the art and do not constitute a novel part of the present invention. As such, no detailed description of these devices 408, 408' will be provided herein.

Figure 9:
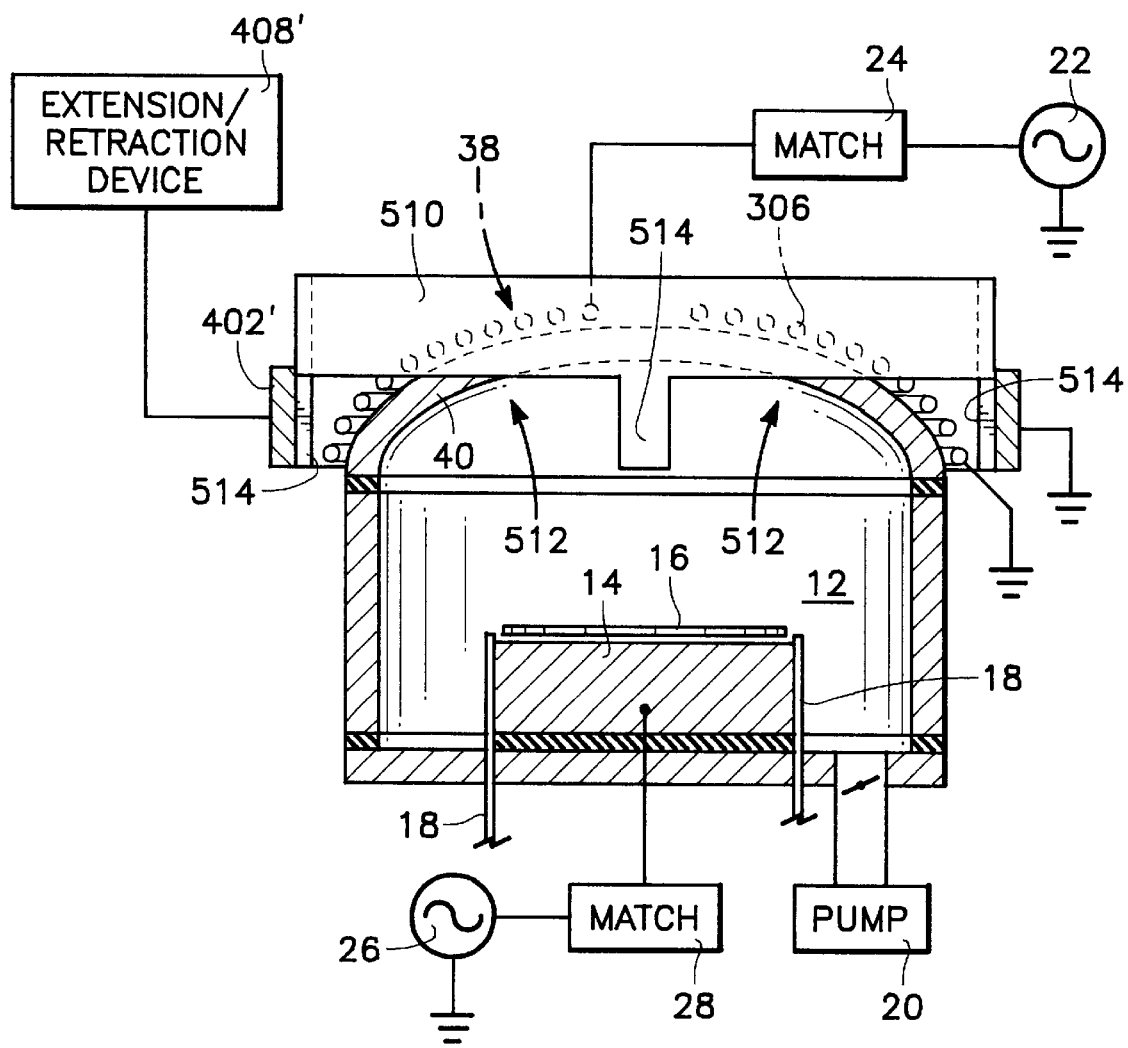
FIG. 9 is a partial cross-sectional view of the inductively coupled plasma reactor of FIG. 3 incorporating a plasma uniformity control apparatus in accordance with another embodiment of the present invention wherein a cover having slots adjacent the lower loops of the antenna is included along with an RF induction field attenuating sleeve surrounding the cover which is capable of covering the slots.

FIG. 9 depicts a practical implementation of the sleeve of FIG. 8 employing the alternate raising or lowering method of varying the attenuating effect. An inductively coupled plasma reactor having a dome-shaped antenna typically includes a grounded conductive metal cover or RF shield inside of which the antenna is mounted. The separation between the antenna and the grounded cover is such that there is no attenuating effect on the RF induction field produced by the antenna. In the embodiment of the present invention associated with FIG. 9, the cover 510 has been reduced in diameter so as to be closely adjacent the lowermost loop 306 of the antenna 38 (similar to the sleeve of FIG. 8). Slots 512 have been formed in the bottom of the cover 510. These slots 512 uncover those lower loops 306 of the antenna 38 which would be subject to the attenuating effects of the cover 510 had the slots 512 not existed. Small legs 514 bound the slots 512 and provide the necessary support for the cover 510, as well as a means to attach the cover to the reactor. It is noted that these legs 514 are preferably narrow so as to have as small an attenuating effect on the RF induction field as possible. An external sleeve 402' is disposed around the outside of the cover 510. The height of the sleeve 402' is at least sufficient to completely enclose the slots 512 when lowered to the base of the cover 510 (as shown in FIG. 9). The external sleeve 402' is raised and lowered by any appropriate raising-lowering device 408', such as one employed in previous embodiments of the present invention. The sleeve 402' is lowered over the slots 512 in order to increase the attenuating effect on the lower loops 306 of the antenna 38. The more of the area of each slot 512 that is covered by the sleeve 402', the greater the attenuating effect.

Figure 10:
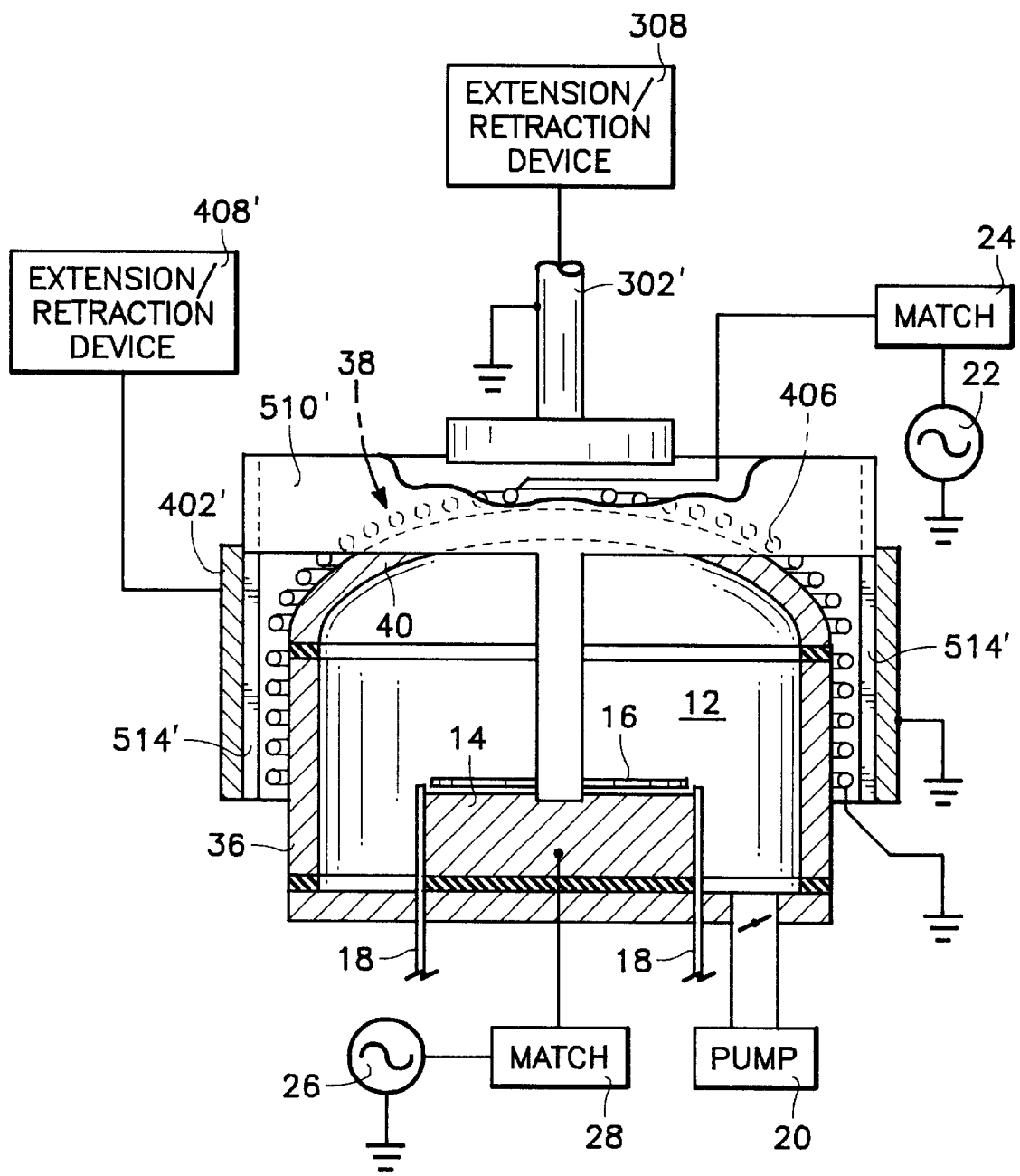
FIG. 10 is a partial cross-sectional view of the inductively coupled plasma reactor of FIG. 4 incorporating a plasma uniformity control apparatus in accordance with another embodiment of the present invention wherein a cover having slots adjacent the lower loops of the antenna is included along with an RF induction field attenuating sleeve surrounding the cover which is capable of covering the slots.

In cases where an inductively coupled plasma reactor exhibits more than one area of higher ion current flux (for example as may occur in a reactor having a combined antenna configuration), conductive bodies could be disposed adjacent those areas only, rather than resorting to the more complex embodiment having a separate element associated with every loop of the antenna (as depicted in FIG. 5). FIG. 10 shows an example of such a plasma uniformity control apparatus incorporated into a reactor having a combined antenna 42 with a dome-shaped upper portion and a cylindrical lower portion. The apparatus of FIG. 10 has a slotted cover 510', and an external sleeve 402" which is capable of surrounding the lower loops 406 the dome-shaped portion of the antenna 42 as well as the entire cylindrical portion. The sleeve 402" is moved up and down by the raising-lowering device 408'. In addition, a conductive plunger 302' is included over the upper loops 406 of the antenna 42. The plunger 302' is moved toward and away from the adjacent portion of the antenna 42 by the extension-retraction device 308. The above-described configuration makes it possible to attenuate the RF induction field associated with both the periphery and center of the wafer 16 being processed in the reactor.

It is noted that the plasma uniformity control methods according to the present invention will have the effect of lowering the average ion current flux level. This results because some of the energy which would have been coupled into the chamber is instead diverted to create the counter-acting induction field associated with the conductive bodies. A lower overall ion current flux level can increase the time required to complete a-wafer etch or deposition process. If a reduced processing time is unacceptable, the RF power fed into the antenna could be increased to compensate for the losses. In this way a uniform etch or deposition rate can be achieved without any undesirable reduction in the processing time.

While the invention has been described in detail by reference to the preferred embodiment described above, it is understood that variations and modifications thereof may be made without departing from the true spirit and scope of the invention. For example, although the foregoing description provided examples of incorporating a plasma uniformity control apparatus in accordance with the present invention into reactors having specific antenna configurations, it is not intended that the invention be limited to those types of reactors. Rather, the present invention can be incorporated into any inductively coupled plasma reactor regardless of the antenna configuration employed therein. In addition, although specific preferred embodiments of conductive bodies in accordance with the present invention where described, it is not intended that the invention be limited to these embodiments. Rather, the conductive bodies can take whatever form desired as long as they provide a surface which when placed adjacent a portion of the reactor's antenna provides a counteracting effect which reduces the component of the RF induction field within the reactor chamber associated with that portion of the antenna. The embodiments of the present invention depicted in FIGS. 5-10 incorporate a placement device used to adjust the separation distance between the conductive body or bodies and the adjacent antenna loop or loops. As was discussed in connection with the embodiment of FIG. 5, a placement device which permanently fixes the separation distance could also be used where the regions of higher ion current flux do not vary significantly with time and where the operating parameters of the reactor are not changed. Such a fixed position placement device could also be employed with any other embodiment of the present invention, if desired.

What is claimed is:

1. A method for controlling spatial distribution of ion current flux across a surface of a workpiece undergoing processing in an inductively coupled plasma reactor comprising a reactor enclosure defining a processing chamber, a radio frequency (RF) antenna disposed around and near a portion of the chamber, and a RF power source connected to the antenna for producing an RF induction field within the chamber which in turn determines the ion current flux on the surface of the workpiece, said method comprising the steps of:

disposing at least one conductive body adjacent to at least one portion of the antenna; and separating the conductive body from the antenna portion by a prescribed separation distance, said separating step causing an attenuation of a component of the RF induction field produced by said antenna portion to a degree depending on the magnitude of the separation distance.

2. The method of claim 1 wherein:

said process comprises a plasma etch or deposition process characterized by an etch deposition rate distribution across the surface of the workpiece;

the separating step comprises choosing the prescribed separation distance between said conductive body and said portion of said antenna so as to create an attenuation of corresponding portions of the RF induction field to an extent which improves uniformity of at least one of (a) etch or deposition rate distribution across the surface of the wafer, (b) ion current flux density distribution across the surface of the wafer.

3. The method of claim 2 wherein said antenna comprises plural radiating elements and the disposing step comprises disposing a separate conductive body adjacent each one of the radiating elements of the antenna.

4. The method of claim 2 wherein a group comprising at least one radiating element of the antenna creates a component of the RF induction field which when unattenuated result in a higher etch or deposition rate distribution a first portion of the wafer than over the remainder of the wafer, and wherein:

the disposing step comprises disposing a single conductive body adjacent to each radiating element of said group; and the separating step comprises separating the single conductive body from each radiating element adjacent thereto by a separation distance sufficient to attenuate said component of the RF induction field to a degree necessary to lower the etch or deposition rate or ion current flux over the first portion of the wafer.

5. The method of claim 2 wherein more than one group comprising at least one radiating element of the antenna create respective components of the RF induction field which when unattenuated result in a higher etch or deposition rate or ion current flux over some portions of the wafer in comparison to the remainder of the wafer, and wherein:

the disposing step comprises disposing a separate conductive body adjacent each group; and the separating step comprises separating each conductive body from each radiating element of each group adjacent thereto by a separation distance sufficient to attenuate said respective components of the RF induction field to a degree necessary to lower the etch or deposition rate or ion current flux over said portions of the wafer exhibiting the higher etch or deposition rate or ion current flux.

6. The method of claim 1 further comprising the step of increasing the power output by RF source to compensate for any lowering of an overall average ion current flux level across the surface of the wafer caused by the attenuation of any component of the RF induction field.

7. An inductively coupled plasma reactor for processing a semiconductor wafer disposed therein, the reactor comprising:

a reactor enclosure defining a processing chamber;

a radio frequency (RF) antenna disposed around or near a portion of the chamber;

an RF power source connected to the antenna; and a plasma uniformity control apparatus for controlling an RF induction field produced by the antenna within the chamber, the control apparatus comprising:

(a) at least one conductive body disposed adjacent to at least one portion of the antenna, (b) placement apparatus for placing said conductive body at a position defining a prescribed separation distance between the body and said one portion of the antenna, wherein the separation distance determines a degree of attenuation the body causes in the RF induction field within the chamber.

8. The reactor of claim 7 further comprising plural separate conductive bodies adjacent respective portions of the antenna.

9. The reactor of claim 8 wherein:

said respective portions of said antenna comprise respective radiating elements of said antenna;

a group of said radiating elements creates a component of the RF induction field which results in one of: (a) a higher ion current flux level over a first portion of the wafer than over the remainder of the wafer, (b) a higher etch or deposition rate over a first portion of the wafer than over the remainder of the wafer; and said respective conductive bodies are disposed adjacent to respective radiating elements of said group.

10. The reactor of claim 8 wherein:

said respective portions of said antenna comprise respective radiating elements of said antenna;

plural groups of said radiating elements create components of the RF induction field which result in areas of higher ion current flux or etch or deposition rate over some portions of the wafer in comparison to the remainder of the wafer; and said respective conductive bodies are disposed adjacent respective ones of said groups of radiating elements.

11. The reactor of claim 7 wherein said conductive body comprises a surface facing said portion of said antenna, and wherein said placement apparatus is capable of moving said conductive body so as to place the surface of the body facing said portion of said antenna as close to the antenna as possible without touching it, thereby causing a maximum degree of attenuation in the RF induction field produced by a portion of the antenna adjacent the body, and moving said conductive body so as to place the body at a separation distance where the conducting body has a negligible attenuating effect on the RF induction field produced by said antenna.

12. The reactor of claim 11 wherein said placement apparatus is capable of placing each conductive body anywhere in between the position whereat the surface of the body facing the antenna portion is as close to the antenna as possible without touching it and the position whereat each conductive body is at a separation distance producing a negligible attenuating effect on the RF induction field.

13. The reactor of claim 7 wherein said conductive body is held at one of (i) ground, or (ii) a floating potential.

14. The reactor of claim 9 wherein the surface of the single conductive body facing the each radiating element of the antenna adjacent thereto has a shape which results in a varying separation distance between the surface and each radiating element adjacent thereto, thereby making the conductive body capable of causing a different degree of attenuation in a portion of the RF induction field associated with each element.

15. The reactor of claim 14 wherein the separation distance between the surface and each radiating element of the antenna adjacent thereto varies as a function of the difference in the strength of the portion of the RF induction field associated with each radiating element.

16. The reactor of claim 9 wherein the antenna comprises a flat coil antenna having plural connected loops each corresponding to one of said radiating elements and which is disposed above a flat ceiling portion of the reactor chamber, and wherein the group comprising at least one radiating element comprises the innermost loops of the antenna, and wherein the single conductive body comprises a plunger disposed over said innermost loops.

17. The reactor of claim 16 wherein the surface of the body facing the antenna corresponds to a bottom face of the plunger, and wherein said bottom face is flat and parallel to a plane of the antenna, and wherein said bottom face is capable of causing a uniform attenuation of the components of the RF induction field associated with the innermost loops of the antenna.

18. The reactor of claim 16 wherein the surface of the body facing the antenna corresponds to a bottom face of the plunger, and wherein said bottom face has a convex shape which is capable of causing a variable attenuation of the components of the RF induction field associated with the innermost loops of the antenna, with a maximum attenuation level corresponding to the loop closest to the center of the antenna and a progressively smaller attenuation level corresponding to each of the successive innermost loops in the radial direction.

19. The reactor of claim 9 wherein the antenna comprises a domeshaped antenna having plural connected loops each corresponding to one of said radiating elements and which surrounds a dome-shaped ceiling portion of the reactor chamber, and wherein the group comprising at least one radiating element comprises the uppermost loops of the antenna, and wherein the single conductive body comprises a plunger disposed over said uppermost loops.

20. The reactor of claim 19 wherein the surface of the body facing the antenna corresponds to a bottom face of the plunger, and wherein said bottom face has a convex shape, and wherein said bottom face is capable of causing a uniform attenuation of the components of the RF induction field associated with the uppermost loops of the antenna.

21. The reactor of claim 19 wherein the surface of the body facing the antenna corresponds to a bottom face of the plunger, and wherein said bottom face is flat, and wherein said bottom face is capable of causing a variable attenuation of the components of the RF induction field associated with the uppermost loops of the antenna, with a maximum attenuation level corresponding to the top loop of the antenna and a progressively smaller attenuation level corresponding to each of the successive loops below the top loop.

22. The reactor of claim 9 wherein the antenna comprises a dome-shaped portion having plural connected loops each corresponding to one of said radiating elements and which surrounds a dome-shaped ceiling section of the reactor chamber, and wherein the group comprising at least one radiating element comprises the lowermost loops of the antenna, and wherein the single conductive body comprises a concentric sleeve capable of surrounding the lowermost loops.

23. The reactor of claim 22 wherein the placing means is capable of increasing and decreasing the diameter of the sleeve while maintaining the sleeve's concentric relationship with the lowermost loops of the antenna, said capability of increasing and decreasing of the sleeve's diameter being employed to place an interior surface of the sleeve at the prescribed separation distance from each loop of the antenna adjacent thereto.

24. The reactor of claim 22 wherein the placing means is capable of raising and lowering the sleeve in relation to the lowermost loops of the antenna while maintaining the sleeve's concentric relationship therewith, said capability of raising and lowering the sleeve employed to place an interior surface of the sleeve at the prescribed separation distance from each loop of the antenna adjacent thereto and to select which of the lowermost loops of the antenna are to be adjacent to the interior surface of the sleeve.

25. The reactor of claim 22 wherein the antenna further comprises a cylindrical portion having plural connected loops each comprising one of said radiating elements and which underlies the dome-shaped portion and surrounds a cylindrical sidewall section of the reactor chamber, and wherein the lowermost loops of the antenna comprise loops of the cylindrical and dome-shaped portions of the antenna.

26. The reactor of claim 22 further comprising a conductive cylindrical cover surrounding the dome-shaped portion of the antenna, said cover having slots corresponding to an area adjacent the lowermost loops of the antenna, and wherein the sleeve is disposed around an exterior surface of the cover and capable of covering said slots thereby surrounding the lowermost loops.

27. The reactor of claim 26 wherein the placing means is capable of raising and lowering the sleeve in relation to the lowermost loops of the antenna, said capability of raising and lowering the sleeve employed to place an interior surface of the sleeve at the prescribed separation distance from each loop of the antenna adjacent thereto and to select which of the lowermost loops of the antenna are to be adjacent to the interior surface of the sleeve.

* * * * *